United States Patent [19]
Adams et al.

[11] Patent Number: 5,956,359
[45] Date of Patent: *Sep. 21, 1999

[54] SEMICONDUCTOR DIODE LASER AND METHOD OF MANUFACTURING SAME

[75] Inventors: Alfred R. Adams; Alistair T. Meney; James R. Downes, all of Guildford, United Kingdom; Adriaan Valster; Gerard A. Acket, both of Waalre, Netherlands

[73] Assignee: Uniphase Opto Holdings, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/670,260

[22] Filed: Jun. 14, 1996

[30] Foreign Application Priority Data

Jun. 16, 1995 [EP] European Pat. Off. ............... 95201613

[51] Int. Cl.$^6$ ....................................................... H01S 3/19
[52] U.S. Cl. ............................................... 372/45; 372/43
[58] Field of Search ................................. 372/45, 43, 44

[56] References Cited

U.S. PATENT DOCUMENTS

| | | | |
|---|---|---|---|
| 5,272,712 | 12/1993 | Arimoto et al. | 372/45 |
| 5,276,698 | 1/1994 | Yoshida et al. | 372/45 |
| 5,331,656 | 7/1994 | Tanaka | 372/45 |
| 5,339,325 | 8/1994 | Kito et al. | 372/45 |
| 5,363,392 | 11/1994 | Kasukawa et al. | 372/45 |
| 5,373,166 | 12/1994 | Buchan et al. | 257/18 |
| 5,559,818 | 9/1996 | Shono et al. | 372/45 |

*Primary Examiner*—Rodney Bovernick
*Assistant Examiner*—Ellen E. Kang
*Attorney, Agent, or Firm*—Michael A. Glenn

[57] ABSTRACT

The invention relates to a laser with a multi quantum well active layer in which a portion of the quantum well and barrier layers is provided with a compression stress, while another portion is provided with an oppositely directed tensile stress. Said stresses are overcompensated such that the net stress is a tensile stress. Preferably, the laser comprises one or several quantum well layers with a compression stress and a number of barrier layers with an excess tensile stress.

8 Claims, 2 Drawing Sheets

SEMICONDUCTOR DIODE LASER AND METHOD OF MANUFACTURING SAME

BACKGROUND OF THE INVENTION

The invention relates to a semiconductor diode laser—often referred to as laser for short hereinafter—with a semiconductor body comprising a substrate of a first conductivity type and situated thereon a semiconductor layer structure with at least a first cladding layer of the first conductivity type, a second cladding layer of a second conductivity type opposed to the first, and between the first and second cladding layers an active layer and a pn junction which, given a sufficient current strength in the forward direction, is capable of generating monochromatic coherent electromagnetic radiation in a strip-shaped active region situated within a resonance cavity formed between two end faces, the active layer comprising one or several quantum well layers of a first semiconductor material which are mutually separated or surrounded by barrier layers of a second semiconductor material, while the second cladding layer and the substrate are electrically connected to connection conductors and a first portion of the quantum well and barrier layers forming part of the active layer has a compression stress because the semiconductor material in the first portion has a lattice constant which is greater than that of the substrate, and a second portion of said layers has a tensile stress because the semiconductor material in the second portion has a lattice constant which is smaller than that of the substrate. It is noted that the term "barrier layers" also refers to so-called separate confinement layers. The invention also relates to a method of manufacturing such a laser.

Such a laser is known from the U.S. Pat. published under No. 5,373,166 on Dec. 13th, 1994. The laser disclosed therein is manufactured in the InP/InGaAsP material system which corresponds to the wavelength region from 1 to 1.5 $\mu$m, and utilizes a Multi Quantum Well (MQW) active layer in which the quantum well and barrier layers comprise a material with a lattice constant which is alternately greater than and smaller than that of the substrate. A greater lattice constant results in a compression stress of the relevant layer, a smaller in a tensile stress. Such a laser has a starting current which is much lower than that of a laser in which all layers exactly match the substrate owing to the influence of the stresses on the shape and position of the valency and conduction band. The known laser is stress-compensated, i.e. the total compression stress is approximately equal to the total tensile stress. In other words, the product of the absolute value of the relative difference in lattice constant and the thickness is the same for both types of layers. Defects in the active layer of the laser will occur less readily thanks to this stress compensation, which benefits useful product life. In addition, such a laser also has a strongly reduced starting current.

A disadvantage of the known laser is that it has too short a life, especially if the laser is manufactured in the GaAs/AlGaAs or the InGaP/InAlGaP material system. This is sometimes a disadvantage in the application in an optical disc system, laser printer, or bar code reader, especially if a high power level is desired there.

SUMMARY OF THE INVENTION

The present invention has for its object inter alia to provide a laser which has not only a low starting current but also a very long life, especially with a comparatively low laser emission wavelength and a high (optical) power emission.

A semiconductor diode laser of the kind mentioned in the opening paragraph is for this purpose characterized in that the relative deviation of the lattice constant compared with that of the substrate and the thicknesses of the two portions of the active layer are so chosen that the total tensile stress in the active layer is greater than the total compression stress, so that part of the stress is compensated and the resulting stress in the active layer is a tensile stress. The invention is based first of all on the surprising recognition that stresses in layers forming part of the active layer are relaxed adjacent the end face. A layer with a compression stress has an increase in its bandgap as a result of this stress, which increase, however, disappears wholly or partly near the end face owing to stress relaxation, so that the bandgap is smaller close to the end face than it is farther away from it. A tensile stress results in a reduction in the bandgap, which again disappears close to the end face owing to relaxation, so that the active layer has a greater bandgap close to an end face in this case. The invention is further based on the recognition that the first case is unfavourable because the absorption of the generated radiation increases near the end face then. The heat generated thereby leads to degradation of the laser. The second case on the other hand is favourable. In fact, an increased bandgap leads to a decreased absorption and thus to a lower degradation, especially a lower so-called end face or mirror degradation of the laser. In the known laser, where both kinds of stress are compensated, the effects thereof and those of any occurring relaxation on the bandgap are compensated. As a result, the known laser has an active layer which has a (substantially) constant bandgap over the entire length of the resonance cavity. In a laser according to the invention, however, which is as it were overcompensated, the bandgap near the end face is greater than elsewhere owing to the net tensile stress. The end face degradation of such a laser is accordingly small and laser life is long, also in the case of a high optical power. In addition, the laser according to the invention profits from the partial compensation of the stresses. This indeed causes the laser to have a particularly low starting current. Furthermore, the active layer of the laser may comprise a comparatively great number of layers or comparatively thick layers each having a stress. This brings with it further advantages, such as a better confinement and a comparatively great wavelength of the generated radiation. The risk of defects arising has already been considerably reduced by the partial compensation. The resulting laser has a particularly long useful life.

It is noted that said effects of a compression or tensile stress on shape and position of valency and conduction bands, and thus on the value of the bandgap, relate exclusively to the influence of mechanical stresses. In practice, the choice of a different lattice constant also implies the choice of a different material—including the choice of a different material composition—which has a much stronger influence on the bandgap. In the case of a compression stress, this means that the bandgap of the active layer is considerably smaller than if there were no stress. In the case of a tensile stress, the bandgap is much greater. The influence of a change in composition, however, is the same over the entire length of the resonance cavity and is unchangeable. Although very important for the direction in which and the degree to which the wavelength of the generated radiation is shifted, the latter effect (which is superimposed on the effects described further above) does not detract from the validity of the discussion in the preceding paragraph.

A method according to the invention whereby on a substrate of a first conductivity type a semiconductor layer structure is provided with at least a first cladding layer of a first conductivity type, an active layer, and a second cladding layer of a second conductivity type opposed to the first, and the active layer is formed by one or several quantum well layers of a first semiconductor material mutually separated or surrounded by barrier layers of a second semiconductor material, the second cladding layer and the substrate being provided with electrical connection conductors, while the first and the second semiconductor material or the compositions thereof are so chosen that a first portion of the layers forming part of the active layer has a lattice constant smaller than that of the substrate, and a second portion has a lattice constant greater than that of the substrate, is characterized in that the values of the differences in lattice constant and the thicknesses of the two portions are so chosen that the opposed stresses in the active layer do not fully compensate one another and the resulting stress is a tensile stress. Lasers according to the invention are obtained by such a method in a simple manner.

In a first embodiment of a laser according to the invention, the first portion of the active layer comprises at least one quantum well layer with a greater tensile stress and the second portion of the active layer comprises at least one barrier layer with a smaller compression stress. The words greater and smaller here mean greater or smaller than the stress in the other portion. The resulting stress depends, as stated above, not only on the degree to which the lattice constant of the relevant layer differs from that of the substrate, but also on the thickness of the relevant layer. This embodiment of the laser has a comparatively low emission wavelength owing to the material effect discussed in the preceding paragraph. The emission wavelength lies, for example, between 630 and 650 nm when this embodiment of the laser is formed in the GaAs/InGaP/InAlGaP material system.

A preferred embodiment of a laser according to the invention is characterized in that the first portion comprises at least one quantum well layer with a smaller compression stress and the second portion comprises at least one barrier layer with a greater tensile stress such that the resulting stress in the active layer is a tensile stress. Such a laser has a comparatively high emission wavelength. It lies, for example, between 650 and 700 nm for a laser in the GaAs/InGaP/InAlGaP material system comprising a quantum well layer of InGaP. Such a laser has a particularly low starting current thanks to the comparatively high emission wavelength. The use of cladding layers having the greatest possible bandgap here in fact implies that the confinement is better than if the emission wavelength were lower.

Preferably, the resulting tensile stress in the active layer of a laser according to the invention is smaller than or equal to approximately 30 nm. %. This means, for example, that the relative deviation of the lattice constant for a layer of 30 nm thickness compared with the substrate is less than −1%. It is avoided thereby that the resulting (tensile) stress leads to defects in the active layer with subsequent degradation of the luminescence.

In a favourable modification, the barrier layers comprise first barrier layers with a small thickness and a great stress and second barrier layers with a great thickness and a small stress. Such a distribution of the stress in the barrier layers over two kinds of barrier layers has the advantage that a great stress is possible while maintaining symmetry around the quantum well layers. This is particularly favourable for the preferred embodiment mentioned above in which the stress, i.e. tensile stress, in the barrier layers must be comparatively great.

A further favourable modification arises when the active layer comprises at least one quantum well layer with a thickness between 4 and 16 nm and at least two barrier layers with a thickness between 2 and 30 nm, the semiconductor material of one of the two portions of the active layer has a relative deviation of the lattice constant compared with the substrate of which the absolute value lies between 0.3 and 2%, and the semiconductor material of the other portion of the active layer has a relative deviation of the lattice constant compared with the substrate of which the absolute value lies between 0.15 and 1%. A symmetrical arrangement is thus possible, and thinner layers may have a comparatively great stress while thicker layers have a somewhat smaller stress. The stresses and thicknesses are so chosen, as noted above, that the product of layer thickness (d) and relative deviation of the lattice constant ($\Delta a/a$) is the same for the portions which compensate one another's stresses. Said product ($d*\Delta a/a$) is summed for each kind of stress if the kind of stress is distributed over several layers. The excess tensile stress, i.e. the result of the summation is preferably smaller than or equal to 30 nm. %.

In the preferred embodiment mentioned above, a very favourable result is obtained when the at least one quantum well layer has a thickness of approximately 8 nm, the at least two barrier layers have thicknesses between 8 and 30 nm, and the first semiconductor material has a relative deviation in its lattice constant compared with the substrate of approximately +1%, while the second semiconductor material has a relative deviation in its lattice constant compared with the substrate of between −1.0 and −0.5%.

A laser according to the invention may advantageously be manufactured in material systems such as the InP/InGaAsP material system and the GaAs/AlGaAs material system. In the latter case, a compression stress and a tensile stress may be realised through the addition of indium and phosphorus atoms, respectively. Preferably, the laser is realised in the GaAs/InGaP/InAlGaP material system. The substrate may comprise GaAs in that case, the quantum well layers InGaP, the barrier layers InAlGaP, and the cladding layers InAlGaP or InAlP. Lasers are created thereby with emission wavelengths below approximately 700 nm and with excellent properties.

BRIEF DESCRIPTION OF THE DRAWINGS

The invention will now be explained in more detail with reference to two embodiments and the accompanying drawing, in which.

The Figures are diagrammatic and not drawn to scale, the dimensions in the thickness direction being particularly exaggerated for greater clarity. Corresponding parts are generally given the same reference numerals in the various Figures.

DESCRIPTION OF THE PREFERRED EMBODIMENTS

Figure 1:
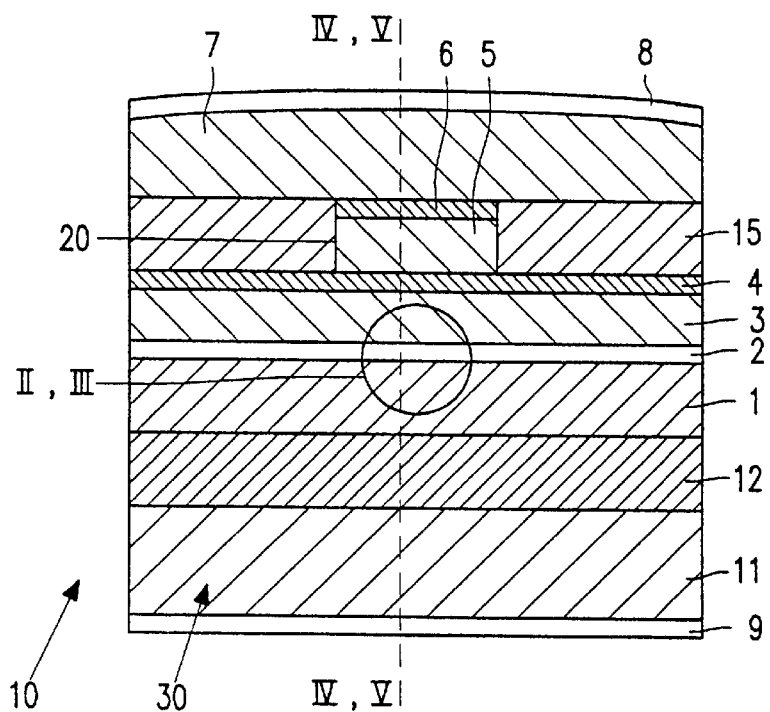
FIG. 1 shows a semiconductor diode laser according to the invention diagrammatically and in a cross-section taken perpendicularly to the longitudinal direction of the resonance cavity, FIGS. 2 and 3 diagrammatically show a first and a second embodiment, respectively, of the active layer of the laser of FIG. 1, and FIGS. 4 and 5 show the influence of the invention on the bandgap ($E_g$) as a function of the distance (S) to an end face for the first and the second embodiment, respectively.

FIG. 1 shows a first and a second embodiment of a laser according to the invention diagrammatically and in a cross-section taken perpendicularly to the longitudinal direction of the resonance cavity. The laser comprises a semiconductor body 10 with a substrate 11 of a first, here the n-conductivity type, in this example consisting of monocrystalline gallium arsenide, provided with a connection conductor 9. On this body, a semiconductor layer structure is provided, in this example comprising a buffer layer 12 of n-AlGaAs, a first cladding layer 1 of n-InAlGaP, an active layer 2 of InGaP and InAlGaP, a second cladding layer 3 of p-InAlGaP, a third cladding layer 5 also of p-InAlGaP, a transition layer 6 of InGaP, and a contact layer 7 of p-GaAs. Between the second cladding layer 3 and the third cladding layer 5 there is a pn junction and in this case an intermediate layer 4 which acts inter alia as an etching stopper layer in the formation of the strip-shaped mesa 20 which comprises the third cladding layer 5 and the transition layer 6. A current blocking layer 15 is present here on either side of the mesa 20 and between the intermediate layer 4 and the contact layer 7. During operation, a strip-shaped active region arises within a resonance cavity below the mesa 20 in the active layer 2. Two end faces 30 of the semiconductor body 10, here acting as mirror surfaces and limiting the resonance cavity in longitudinal direction, are parallel to the plane of drawing. The laser in this example is of the so-called index-guided type. The electrical connection of the pn junction situated between the first and the second cladding layer 1, 3 is effected by means of connection conductors 8, 9 on the contact layer 7 and the substrate 1, respectively.

Figure 2:
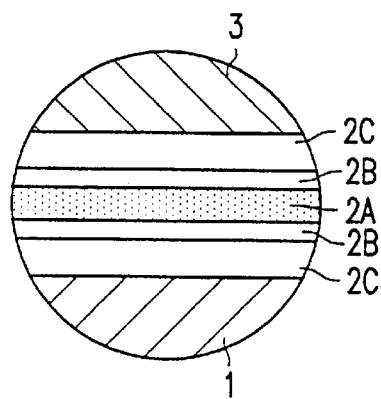

FIG. 2 shows the construction of the active layer 2 of a first example of the laser of FIG. 1. The active layer 2 comprises a single quantum well layer 2A which is surrounded by two barrier layers 2B. According to the invention, a portion of the active layer 2, here the quantum well layer 2A, has a compression stress while another portion of the active layer 2, here two barrier layers 2B, has a tensile stress which is effectively greater than the compression stress, so that the resultant net stress in the active layer 2 is a tensile stress. The stress situation in the active layer 2 necessary for the invention is achieved in this example as listed in the Table below. $\Delta a/a$ therein is the relative difference in lattice constant compared with the substrate 11 and d is the thickness of the layer in question. The resultant tensile stress in the active layer 2 is: $2*(16)*(-0.5)+1*(8)*(+1)=-8$ nm* %, the absolute value of which is smaller, in this case much smaller than 30 nm. %. This means that there is practically no risk of stress-induced defects occurring in the active layer 2. The stress relaxation in quantum well layer 2A and barrier layers 2B which occurs in the laser near the end faces 3 and the overcompensation of the compression stress cause a greater bandgap ($E_g$) near the end faces 30 in the active layer, so that the absorption of radiation generated in the active region decreases (strongly) near the end face 30. End face or mirror degradation in the laser according to the invention is substantially lower as a result of this than in the known laser, and the former has a considerably improved useful life. Thicknesses and compositions chosen for the two portions of the active layer 2 preferably lie in the domains mentioned in the introductory description. Lasers whose layers have properties lying within these domains yield the favourable results. The Table also contains relevant data on the other layers of the two embodiments of the laser, showing that in this example the active layer 2 also comprises two further barrier layers 2C which act as so-called separate cladding layers 2C and which in this example have the same lattice constant as the substrate 11.

| Layer | Semiconductor | Type | Conc. (at/cm$^3$) | d ($\mu$m) | $\Delta a/a$ (%) |
|---|---|---|---|---|---|
| 11 | GaAs | N | $2 \times 10^{18}$ | 350 | 0 |
| 12 | Al$_{0.20}$Ga$_{0.80}$As | N | $2 \times 10^{18}$ | 0.1 | 0 |
| 1 | In$_{0.50}$Al$_{0.35}$Ga$_{0.15}$P | N | $5 \times 10^{17}$ | 1.4 | 0 |
| 2A | In$_{0.62}$Ga$_{0.38}$P | — | — | 0.008 | +1.0 |
| 2B | In$_{0.42}$Al$_{0.23}$Ga$_{0.35}$P | — | — | 0.016 | −0.5 |
| 2C | In$_{0.50}$Al$_{0.20}$Ga$_{0.30}$P | — | — | 0.030 | 0 |
| 3 | In$_{0.50}$Al$_{0.35}$Ga$_{0.15}$P | P | $3 \times 10^{17}$ | 0.3 | 0 |
| 4 | In$_{0.49}$Ga$_{0.51}$P | P | $1 \times 10^{18}$ | 0.05 | 0 |
| 5 | In$_{0.50}$Al$_{0.35}$Ga$_{0.15}$P | P | $3 \times 10^{17}$ | 1.1 | 0 |
| 6 | In$_{0.49}$Ga$_{0.51}$P | P | $1 \times 10^{18}$ | 0.01 | 0 |
| 7 | GaAs | P | $2 \times 10^{18}$ | 0.8 | 0 |
| 15 | GaAs | N | $1 \times 10^{18}$ | 0.8 | 0 |

Figure 4:
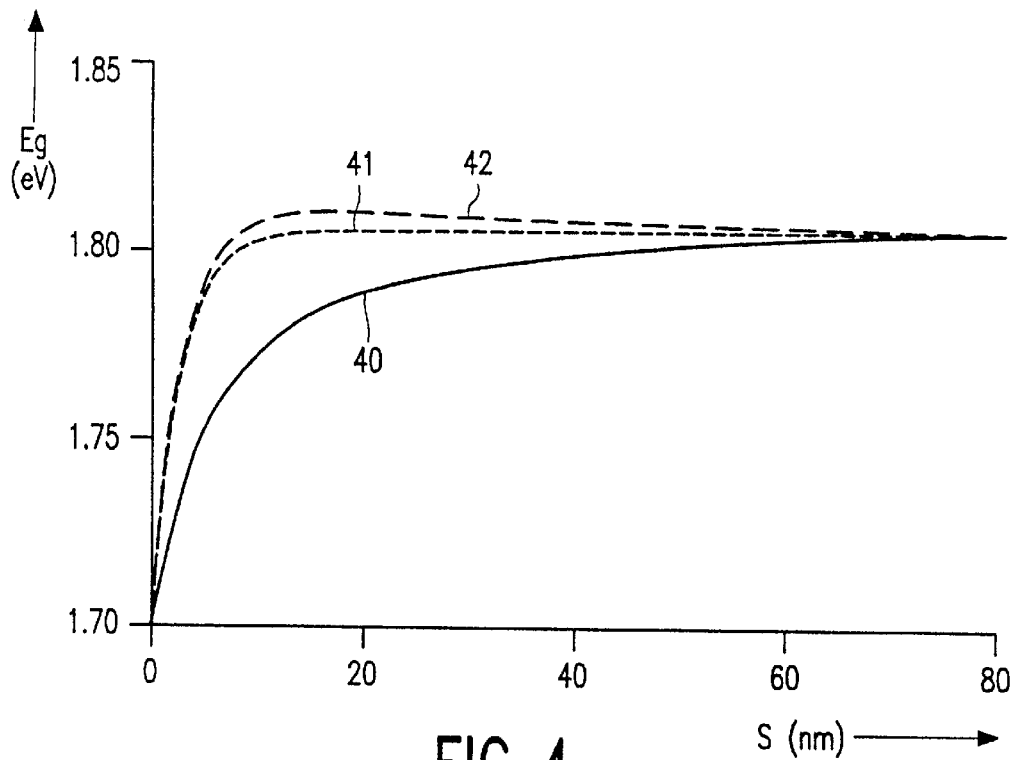

In FIG. 4, curve 42 represents the bandgap ($E_g$) of the active layer 2 as a function of the distance (S) to the end face 30 of the laser of this example. Curve 42 shows that the bandgap of the active layer 2 is greater, here by approximately 15 meV, between approximately 10 and 80 nm from the end face 30 than at a greater distance from the end face 30. This means that absorption of radiation generated in the laser in the region adjoining the end face 30 is considerably smaller than in a laser where the compression stress and tensile stress are mutually compensated. In that case, in fact, the bandgap gradient is as shown in curve 41. It should also be borne in mind here that absorption of the generated radiation depends exponentially on the bandgap ($E_g$). For comparison, finally, curve 40 shows the case where the active layer 2 has a compression stress, exclusively or as a net result, which yields an even worse situation than in the stress-compensated case of curve 41.

The width of the mesa 20 is 5 $\mu$m. The length and width of the semiconductor body 10 and the length of the mesa 20 are approximately 500 $\mu$m. The conductive layers 8, 9 are of usual thickness and composition. The emission wavelength of this embodiment of the laser realized in the InGaP/InAlGaP material system is approximately 680 nm. The laser is manufactured in a usual manner for the major part. Briefly, manufacture proceeds as follows. The layers 12 and 1 to 6 are provided on substrate 11 in a first growing process. The material compositions and thicknesses in accordance with the invention, here as listed in the Tables, are chosen for the active layer 2 in this case. Then the mesa 20 is formed by etching on both sides of a strip-shaped mask of SiO$_2$ down to the etching stopper layer 4. In a second epitaxy process, the current blocking layer 15 is provided on either side of the mesa 20, resulting in a substantially planar structure. Finally, after the SiO$_2$ mask has been removed, the contact layer 7 is provided over the structure in a third growing process. After two-sided metallization 8, 9 and cleaving in two directions, the lasers are ready for use.

Figure 3:
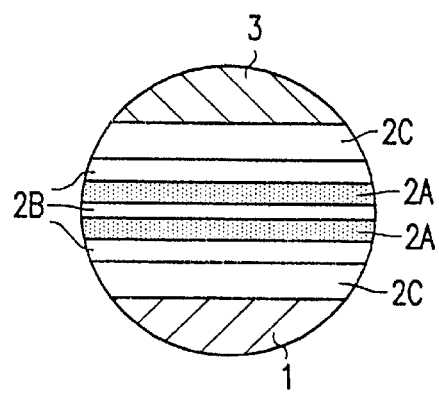

FIG. 3 shows the construction of the active layer 2 of a second embodiment of a laser according to the invention having the structure of FIG. 1. The active layer 2 in this example comprises two quantum well layers 2A mutually separated and surrounded by three barrier layers 2B, of which the outermost layers are surrounded by two further barrier layers 2C which act as separate cladding layers. The other layers 12, 1, 3 to 7, 15 and the substrate 11 of the laser are the same as in the first embodiment of the laser. According to the invention, a portion of the active layer 2, here the quantum well layers 2A, has a compression stress while another portion of the active layer 2, here three barrier layers 2B and two further barrier layers 2C, has a tensile stress which is effectively greater than the compression stress, so that the resulting net stress in the active layer 2 is a tensile stress. In this example, the desired stress situation in the active layer 2 has been achieved as indicated in the Table below. The resulting tensile stress is: $3*(8)*(-1)+2*(24)*(-0.5)+2*(8)*(+1)=-32$ nm* %, the absolute value of which is approximately 30 nm. %. In this example, the total tensile stress present is distributed over two kinds of barrier layers 2C, 2D. This has the advantage that a great tensile stress is possible while the symmetry around the quantum well layers 2A is maintained. Relaxation of the stress in quantum well layers 2A and barrier layers 2C, 2D occurs close to the end faces 30 also in this embodiment of the laser. Owing to the overcompensation of the compression stress, an increase in the bandgap occurs again near the end faces 30 in the active layer 2, so that the absorption of radiation generated in the active region is (strongly) reduced near the end face 30. The end face or mirror degradation in the laser according to the invention is thus much lower than in the known laser, and the former has a much improved useful life. The wavelength of the generated radiation in this embodiment of the laser is again approximately 680 nm. The stress in the barrier layers 2B, 2C is advantageously distributed in this embodiment. That is to say that the barrier layers 2B are thin and have a high tensile stress, while the barrier layers 2C are thick and have a lower compression stress, which renders it easier to obtain a symmetrical construction.

| Layer | Semiconductor | Type | Conc. (at/cm$^3$) | d ($\mu$m) | $\Delta a/a$ (%) |
|---|---|---|---|---|---|
| 2A | In$_{0.62}$Ga$_{0.38}$P | — | — | 0.008 | +1.0 |
| 2B | In$_{0.35}$Al$_{0.26}$Ga$_{0.39}$P | — | — | 0.008 | −1.0 |
| 2C | In$_{0.42}$Al$_{0.23}$Ga$_{0.35}$P | — | — | 0.024 | −0.5 |

Figure 5:
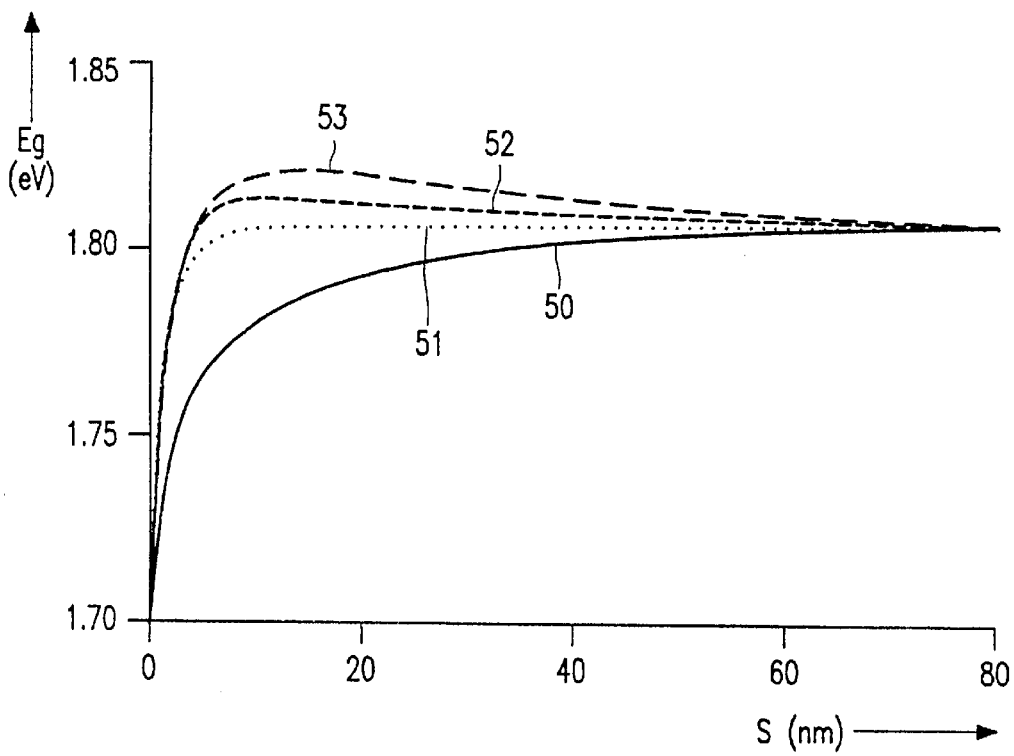

In FIG. 5, curve 53 represents the bandgap ($E_g$) of the active layer 2 as a function of the distance (S) to the end face 30 for this embodiment of the laser. Curve 53 shows that the bandgap of the active layer 2 is greater by a few tens of meV, here by approximately 25 meV, between approximately 10 and 80 nm from the end face 30 than at a greater distance from the end face 30. This means that the absorption of radiation generated in the laser is much lower in this region than in a laser in which the compression stress and tensile stress are mutually compensated. In the latter case, the bandgap has a gradient as shown with curve 51. Curve 50 shows the case in which the active layer 2 has a compression stress only, which leads to an even worse situation than in the stress-compensated case of curve 51. The influence of the outer barrier layers 2C is illustrated with curve 52. Curve 52 refers to the situation corresponding to the above Table, but with the two outermost barrier layers 2C omitted. In that case, too, the favourable effect according to the invention is present, but to approximately the same degree as in the first embodiment of the laser. Thanks to a net tensile stress which has approximately the maximum admissible value of 30 nm. %, the advantage of the invention in the present example is a maximum in the situation corresponding to curve 53.

The invention is not limited to the embodiments given, many modifications and variations being possible to those skilled in the art within the scope of the invention. Thus different semiconductor materials or different compositions of the chosen semiconductor materials may be used compared with those mentioned in the examples. This relates in particular to the use of the material systems InP/InGaAsP and GaAs/AlGaAs mentioned earlier. Furthermore, the invention is not limited to situations in which the quantum well layers and/or the barrier layers each have only one type of stress. Thus it is possible for quantum well layers with a compression stress and with a tensile stress to be present simultaneously. In that case the emission wavelength of both may sometimes be rendered equal through the use of the quantum effect, i.e. through adaptation of the thickness (ratio) of the quantum well layers.

It is also possible to replace the conductivity types all (simultaneously) with their opposites. Various techniques, such as MOVPE (=Metal Organic Vapour Phase Epitaxy), etc. may be used for providing the semiconductor layers.

The invention is furthermore not limited to the laser embodiment described here which is of the BR (=Buried Ridge) type. The invention may also be used for other types such as the BH (=Buried Hetero) type or the RW (=Ridge Waveguide) type, etc.

What is claimed is:

1. A semiconductor diode laser with a semiconductor body comprising a substrate of a first conductivity type and situated thereon a semiconductor layer structure with at least a first cladding layer of the first conductivity type, a second cladding layer of a second conductivity type opposite the first conductivity type, and between the first and second cladding layers an active layer and a pn junction which, given a sufficient current strength in the forward direction, is capable of generating monochromatic coherent electromagnetic radiation in a strip-shaped active region situated within a resonance cavity formed between two end faces, the active layer comprising at least one quantum well layer of a first semiconductor material which are mutually separated or surrounded by at least one barrier layer of a second semiconductor material, the second cladding layer and the substrate being electrically connected to connection conductors, the at least one quantum well layer having a compression stress and the at least one barrier layer having a tensile stress, the tensile stress being greater than the compression stress so that the resultant stress in the active layer is a tensile stress, and wherein the relative deviation of the lattice constant ($\Delta a/a$) of the first and second semiconductor materials compared with that of the substrate and the thicknesses (d) of the at least one quantum well layer and the at least one barrier layer are chosen so that a bandgap in end face regions of the semiconductor body in the vicinity of the two end faces is greater than a bandgap throughout the remainder of the semiconductor body, whereby heat build-up, absorption of emitted radiation in the end face regions, and degradation of luminescence are reduced relative to semiconductor diode lasers in which the bandgap is substantially constant throughout the semiconductor body.

2. The semiconductor diode laser as set forth in claim 1, wherein:
   each of the at least one quantum well layers has a thickness between 4 and 16 nm;
   each of the at least one barrier layers has a thickness of between 2 and 30 nm;
   the absolute value of the relative deviation of the lattice constant of the first semiconductor material compared with that of the substrate is in a range of between 0.3% to 2%; and,
   the absolute value of the relative deviation of the lattice constant of the second semiconductor material compared with that of the substrate is in a range of between 0.15% to 1%.

3. The semiconductor diode laser as set forth in claim 2, wherein the at least one barrier layer comprises a first barrier layer having a first thickness and a first stress, and a second barrier layer having a second thickness and a second stress, wherein the first thickness is less than the second thickness and the first stress is greater than the second stress.

4. The semiconductor diode laser as set forth in claim 1, wherein the at least one barrier layer comprises a first barrier layer having a first thickness and a first stress, and a second barrier layer having a second thickness and a second stress, wherein the first thickness is less than the second thickness and the first stress is greater than the second stress.

5. The semiconductor diode laser as set forth in claim 1, wherein:

each of the at least one quantum well layers has a thickness of approximately 8 nm;

each of the at least one barrier layers has a thickness in a range of between 8 and 30 nm;

the relative deviation of the lattice constant of the first semiconductor material compared with that of the substrate is in a range of approximately +1%; and, the relative deviation of the lattice constant of the second semiconductor material compared with that of the substrate is in a range of between −1.0% to −0.5%.

6. The semiconductor diode laser as set forth in claim 5, wherein the at least one barrier layer comprises a first barrier layer having a first thickness and a first stress, and a second barrier layer having a second thickness and a second stress, wherein the first thickness is less than the second thickness and the first stress is greater than the second stress.

7. The semiconductor diode laser as set forth in claim 5, wherein:

the substrate is made of GaAs;

the first semiconductor material is InGaP;

the second semiconductor material is InAlGaP; and, the first and second cladding layers are each made of a material selected from a group consisting of InAlGaP and InAlP.

8. The semiconductor diode laser as set forth in claim 1, wherein:

the substrate is made of GaAs;

the first semiconductor material is InGaP;

the second semiconductor material is InAlGaP; and, the first and second cladding layers are each made of a material selected from a group consisting of InAlGaP and InAlP.

* * * * *